(12) United States Patent
Tatsumi

(10) Patent No.: US 7,045,810 B2
(45) Date of Patent: May 16, 2006

(54) MONOLITHIC MULTIPLE-WAVELENGTH LASER DEVICE AND METHOD OF FABRICATING THE SAME

(75) Inventor: Masaki Tatsumi, Tenri (JP)

(73) Assignee: Sharp Kabushiki Kaish, Osaka (JP)

( * ) Notice: Subject to any disclaimer, the term of this patent is extended or adjusted under 35 U.S.C. 154(b) by 132 days.

(21) Appl. No.: 10/735,476

(22) Filed: Dec. 11, 2003

(65) Prior Publication Data

US 2004/0124424 A1 Jul. 1, 2004

(30) Foreign Application Priority Data

Dec. 11, 2002 (JP) ............................ 2002-359370

(51) Int. Cl.
*H01S 5/223* (2006.01)
*H01L 21/18* (2006.01)

(52) U.S. Cl. ...................... 257/14; 372/50.121; 438/35
(58) Field of Classification Search ................. 257/13, 257/15, 88, 89, 14; 372/23, 50.121; 438/35
See application file for complete search history.

(56) References Cited

U.S. PATENT DOCUMENTS

| | | | | |
|---|---|---|---|---|
| 6,287,884 | B1* | 9/2001 | Jie et al. ........................ | 438/39 |
| 6,358,764 | B1* | 3/2002 | Nemoto ........................ | 438/22 |
| 6,480,456 | B1* | 11/2002 | Kawamura et al. .......... | 369/120 |
| 6,757,311 | B1* | 6/2004 | Abe .......................... | 372/43.01 |
| 6,865,203 | B1* | 3/2005 | Yoshida et al. ........... | 372/46.01 |
| 2002/0185643 | A1* | 12/2002 | Uchida et al. ................ | 257/40 |
| 2003/0021320 | A1* | 1/2003 | Kan ............................ | 372/46 |
| 2003/0043875 | A1* | 3/2003 | Gen-Ei et al. ................ | 372/46 |
| 2003/0194823 | A1 | 10/2003 | Miyazake et al. | |

FOREIGN PATENT DOCUMENTS

| | | |
|---|---|---|
| CN | 1316810 A | 10/2001 |
| EP | 1 126 526 A2 | 8/2001 |
| JP | 2000-091698 | 3/2000 |
| JP | 2001-320132 | 11/2001 |
| JP | 2002-026454 | 1/2002 |
| JP | 2002-299764 | 10/2002 |

OTHER PUBLICATIONS

U.S. Appl. No. 10/715,025, filed Nov. 18, 2003, Ueda et al.
Office Action issued Jul. 8, 2005, for Chinese Patent Application No. 200310123374.4 filed Dec. 11, 2003, 9 pages.

* cited by examiner

*Primary Examiner*—Carl Whitehead, Jr.
*Assistant Examiner*—Jennifer M Dolan
(74) *Attorney, Agent, or Firm*—Morrison & Foerster LLP

(57) ABSTRACT

A monolithic multiple-wavelength laser device includes a laser section of a first wavelength and a laser section of a second wavelength formed on a single GaAs substrate, wherein the laser section f the first wavelength includes a real guide structure, and the laser section of the second wavelength includes a loss guide structure. In such a multiple-wavelength laser device, loss in wave guiding can be reduced and operating current can be decreased, compared to a conventional device, when the first wavelength is within a wavelength band of about 780 nm and the second wavelength is within a wavelength band of about 650 nm, since the laser section of the first wavelength has the real guide structure.

8 Claims, 6 Drawing Sheets

MONOLITHIC MULTIPLE-WAVELENGTH LASER DEVICE AND METHOD OF FABRICATING THE SAME

BACKGROUND OF THE INVENTION

1. Field of the Invention

The present invention relates to improvement of a monolithic multiple-wavelength laser device including a plurality of laser sections formed on a single substrate, and improvement of a method of fabricating the same.

2. Description of the Background Art

Optical disks for optically recording information, such as CDs (compact disks), DVDs (digital video disks), and MDs (mini disks), are now widely used as high-capacity recording media.

In using such an optical disk, information is recorded and reproduced via an optical pickup. Depending on the difference in recording densities which vary according to the types of the optical disks, an optical pickup for reproducing a CD uses laser light of a wavelength band of about 780 nm, and an optical pickup for reproducing a DVD uses laser light of a wavelength band of about 650 nm.

In recent years, instead of optical disk devices each for reproducing a CD or a DVD exclusively, an optical disk device capable of reproducing both a CD and a DVD has been developed, using an optical pickup including a multiple-wavelength semiconductor laser device formed by integrating semiconductor laser devices of lasing wavelength bands of about 650 nm and about 780 nm.

A schematic cross sectional view of FIG. 4 shows an example of a conventional monolithic multiple-wavelength laser device. It is to be noted that, in the drawings of the present application, the same or corresponding portions are denoted by the same reference numbers. Further, in the drawings of the present application, dimensional relation among length, thickness, width, and the like is changed as appropriate to clarify and simplify the drawings, and it does not represent the actual dimensional relation.

In the monolithic multiple-wavelength laser device of FIG. 4, on an n type GaAs inclined substrate 601 having a main surface 15° off a crystallographic (001) plane toward a [110] direction, a laser section 602 for a CD and a laser section 603 for a DVD are formed in parallel.

In CD laser section 602, an n type GaAs buffer layer 604, an n type $Al_{0.5}Ga_{0.5}As$ clad layer 605, an n type $Al_{0.3}Ga_{0.7}As$ guide layer 606, an active layer 607, a p type $Al_{0.3}Ga_{0.7}As$ guide layer 608, a p type $Al_{0.5}Ga_{0.5}As$ first clad layer 609, and a p type GaAs etch stop layer 610 are formed successively. On p type GaAs etch stop layer 610, a ridge-shaped p type $Al_{0.5}Ga_{0.5}As$ second clad layer 611 and a p type GaAs cap layer 612 are formed successively, and both sides of the ridge are buried in n type GaAs current blocking layers 613.

In DVD laser section 603, an n type GaAs buffer layer 614, an n type GaInP buffer layer 615, an n type $(Al_{0.7}Ga_{0.3})_{0.5}In_{0.5}P$ clad layer 616, an undoped $(Al_{0.5}Ga_{0.5})_{0.5}In_{0.5}P$ guide layer 617, an active layer 618, an undoped $(Al_{0.5}Ga_{0.5})_{0.5}In_{0.5}P$ guide layer 619, a p type $(Al_{0.7}Ga_{0.3})_{0.5}In_{0.5}P$ first clad layer 620, and a p type GaInP etch stop layer 621 are formed successively. On p type GaInP etch stop layer 621, a ridge-shaped p type $(Al_{0.7}Ga_{0.3})_{0.5}In_{0.5}P$ second clad layer 622, a p type GaInP intermediate layer 623, and a p type GaAs cap layer 624 are formed successively, and both sides of the ridge are buried in n type GaAs current blocking layer 613.

On p type GaAs cap layers 612 and 624 in CD laser section 602 and DVD laser section 603, respectively, a p type ohmic electrode 625 and an Mo/Au electrode 626 are formed successively. An n type ohmic electrode 627 is formed on the back side of n type GaAs substrate 601.

A laser section isolating trench 628 is formed between CD laser section 602 and DVD laser section 603 to reach substrate 601, to electrically isolate the both laser sections from each other. Each monolithic multiple-wavelength laser device is separated from a wafer along a chip separating trench 629.

The monolithic two-wavelength semiconductor laser device of FIG. 4 fabricated as described above is mounted on a sub-mount, with its n type electrode side up, and with its p type electrode side mounted on a surface of the sub-mount. Then, the sub-mount is attached on a prescribed stem.

The monolithic two-wavelength semiconductor laser device including loss guide structures utilizing GaAs buried layers 613 as shown in FIG. 4 is preferable in that the buried layers in both of the CD laser section and the DVD laser section can easily be formed simultaneously. In the loss guide structure, however, operating current of the laser device is increased due to large loss in wave guiding, significantly narrowing the allowable range of thermal design and the like in optical pickup design. Consequently, it is preferable to employ a real guide structure by using for the current blocking layer a material such as AlInP or a dielectric film which allows laser light for a CD and laser light for a DVD to pass through.

In the case that AlInP is used for the current blocking layer, however, the growth of the current blocking layer on the sides of the ridge in the CD laser section is slow, making it difficult to control growth conditions for burying the ridge completely. Further, since unnecessary AlInP layer portions having grown on the p type GaAs cap layers in the CD and DVD laser sections are not flat-shaped, it is difficult to control process conditions for removing the unnecessary portions. In the case that a dielectric film is used for the current blocking layer, thermal conductivity of the dielectric film itself is lower than that of the semiconductor crystal and thus thermal radiation efficiency is deteriorated, making it difficult to maintain high temperature characteristics and ensure reliability especially in the DVD laser section which originally does not have so good temperature characteristics.

In each of the CD and DVD laser sections, feedback light noise may be caused due to interference with light reflected from an external optical system. To reduce such noise, it is desired to employ a self-pulsation structure in each laser section. The self-pulsation structure can be implemented by adjusting a difference $\Delta N$ in effective refractive indices in and out of the ridge in a horizontal direction, and an optical confinement factor $\Gamma$ in the active layer. However, design ranges of $\Delta N$ and $\Gamma$ for causing self-pulsation have a trade-off relation with respect to improvement of reliability and reduction of operating current in the laser device.

SUMMARY OF THE INVENTION

In view of the situation of the prior art described above, an object of the present invention is to easily provide a monolithic multiple-wavelength laser device having maintained reliability as well as improved operating current, reduced feedback light noise, and the like.

According to the present invention, a monolithic multiple-wavelength laser device includes a laser section of a first wavelength and a laser section of a second wavelength formed on a single GaAs substrate, wherein the laser section of the first wavelength includes a real guide structure and the laser section of the second wavelength includes a loss guide structure. In the case that the first wavelength is within a wavelength band of about 780 nm and the second wavelength is within a wavelength band of about 650 nm in such a multiple-wavelength laser device, loss in wave guiding can be reduced and operating current can be decreased as compared to a conventional device, because the laser section of the first wavelength has the real guide structure.

A buried layer on either side of a ridge portion included in the laser section of the first wavelength is preferably formed with a three-layer structure including a GaAs layer having a thickness of more than 0.03 μm and less than 0.05 μm, an AlGaAs layer having a thickness of more than 0.05 μm and less than 0.1 μm, and an insulative dielectric film having a refractive index lower than that of the ridge portion. Since a horizontal lasing mode in the laser section of the first wavelength is achieved by a structure for confining light with the insulative dielectric film having a low refractive index, it is desirable to make the GaAs layer and the AlGaAs layer thin so as not to affect the horizontal mode.

It is desired that the insulative dielectric film of a low refractive index has a refractive index in a range of 1 to 2. That is, since material for the ridge portion in the laser section of the first wavelength has a refractive index in a range of 3.2 to 3.4, it is desired that the insulative dielectric film has a refractive index lower than that of the material for the ridge portion to confine light in the lasing resonator. A silicon nitride film or a silicon oxide film may be selected as such an insulative dielectric film.

It is preferable that the insulative dielectric film of a low refractive index has a thickness in a range of 0.1 μm to 0.2 μm. In the case that an additional insulative dielectric film of a low refractive index is formed over the laser section of the second wavelength, since the insulative dielectric film exhibits low thermal conductivity compared to the semiconductor crystal and then thermal radiation is deteriorated, the insulative dielectric film may be made thin to prevent degradation in temperature characteristics and reliability in the laser section of the second wavelength.

It is preferable that the GaAs substrate surface has an off-angle in a range of 5° to 25° from a (001) plane toward a [110] direction. This is for purposes of adjusting the wavelength of the laser section of the second wavelength and improving crystallinity of both the laser sections of the first wavelength and of the second wavelength, thereby improving laser device characteristics. The off-angle is more preferably 10° to 20°, and still more preferably 13° to 18°.

In a method of fabricating the monolithic multiple-wavelength laser device according to the present invention, the insulative dielectric film of a low refractive index is formed at a film deposition temperature preferably in a range of 150° C. to 400° C., and more preferably in a range of 150° C. to 250° C.

It is preferable that each of the ridge portions included in the laser sections of the first wavelength and of the second wavelength is buried by a multi-layered structure formed with a GaAs layer, an $Al_xGa_{1-x}As$ ($0.4 \leq x \leq 0.7$) etch stop layer, and a GaAs current blocking layer. It is also preferable that, in the multi-layered structure burying the ridge portion in the laser section of the first wavelength, an ammonia-based etchant is used for the GaAs current blocking layer and a hydrofluoric acid-based etchant is used for the etch stop layer to selectively etch the layers such that etching stops at respective underlying layers, and the ridge portion in the laser section of the first wavelength exposed thereafter is buried by the insulative dielectric film of a low refractive index.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

According to experimental consideration by the present inventor, it has been found that, compared to the loss guide structure, the real guide structure has narrower allowable design ranges of difference ΔN in the effective refractive indices in and out of the ridge in the horizontal direction and optical confinement factor Γ in the active layer and it is practically difficult to control them appropriately. Especially, it is not preferable to employ the real guide structure in the DVD laser section.

However, according to the consideration by the inventor, it has been thought that the real guide structure can be employed in the CD laser section, since the allowable design ranges of ΔN and Γ for causing self-pulsation in the CD laser section are wide independently of the real guide structure or the loss guide structure.

First Embodiment

Figure 1:
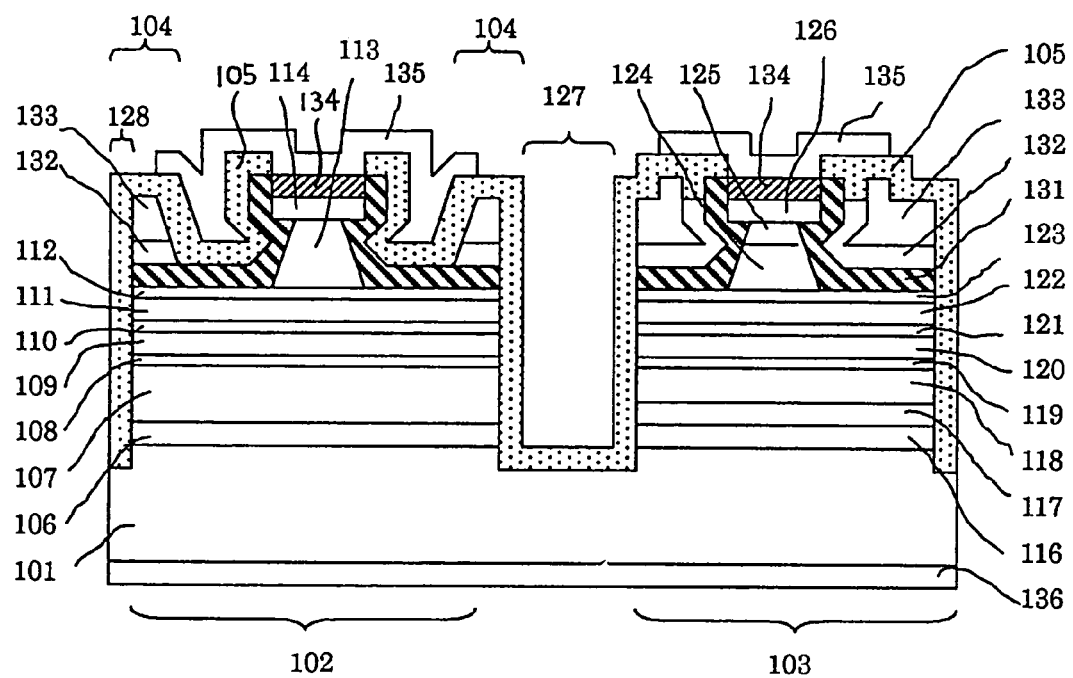
FIG. 1 is a schematic cross sectional view showing a monolithic two-wavelength semiconductor laser device according to a first embodiment of the present invention.

The schematic cross sectional view of FIG. 1 shows a monolithic two-wavelength semiconductor laser device according to the first embodiment of the present invention.

In this semiconductor laser device, on an n type GaAs inclined substrate 101 having a main surface 15° off a (001) plane toward a [110] direction, a laser section 102 for a CD and a laser section 103 for a DVD each including a ridge structure are formed in parallel. CD laser section 102 includes a terrace portion 104 and a real guide structure in which either side of the ridge portion is buried in an insulative dielectric film 105 having a refractive index lower than that of the ridge portion. On the other hand, DVD lasing section 103 includes a loss guide structure in which either side of the ridge portion is buried in primarily n-type GaAs crystals 131 and 133.

Schematic cross sectional views of FIGS. 2A to 2M show an example of a method of fabricating the multiple-wavelength laser device of FIG. 1.

Figure 2A:
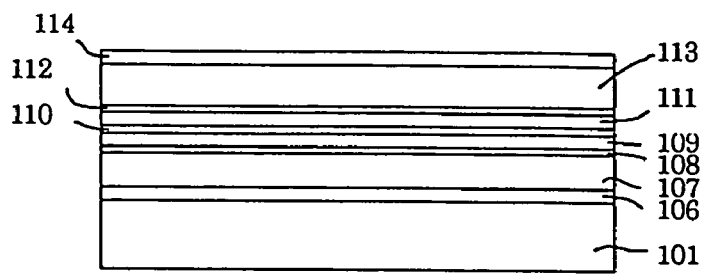
FIGS. 2A–2M are schematic cross sectional views showing a process for fabricating the laser device of FIG. 1.

Firstly, as shown in FIG. 2A, MOCVD (Metalorganic Chemical Vapor Deposition) is performed to form a semiconductor stacked-layered structure for the CD laser section on n type GaAs inclined substrate 101 having the main surface inclined at an off-angle of 15° from the (001) plane toward the [110] direction. Specifically, an n type GaAs buffer layer 106, an n type $Al_{0.5}Ga_{0.5}As$ clad layer 107, an n type $Al_{0.3}Ga_{0.7}As$ guide layer 108, an active layer 109 having an MQW (Multiple Quantum Well) structure, a p type $Al_{0.3}Ga_{0.7}As$ guide layer 110, a p type $Al_{0.5}Ga_{0.5}As$ first clad layer 111, a p type GaAs etch stop layer 112, a p type $Al_{0.5}Ga_{0.5}As$ second clad layer 113, and a p type GaAs cap layer 114 are formed successively.

Figure 2B:
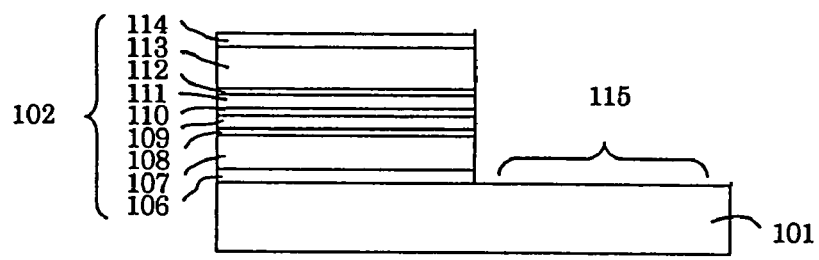

Next, as shown in FIG. 2B, to form a semiconductor stacked-layered structure for the DVD laser section, photolithography is performed to form a resist pattern (not shown) shaped in a band of a prescribed width on the structure for the CD laser section. Using the resist pattern as a mask, wet etching is performed on p type GaAs cap layer 114, p type $Al_{0.5}Ga_{0.5}As$ second clad layer 113, p type GaAs etch stop layer 112, p type $Al_{0.5}Ga_{0.5}As$ first clad layer 111, undoped $Al_{0.3}Ga_{0.7}As$ guide layer 110, active layer 109, undoped $Al_{0.3}Ga_{0.7}As$ guide layer 108, n type $Al_{0.5}Ga_{0.5}As$ clad layer 107, and n type GaAs buffer layer 106, to expose a substrate surface 115 by the prescribed width.

Figure 2C:
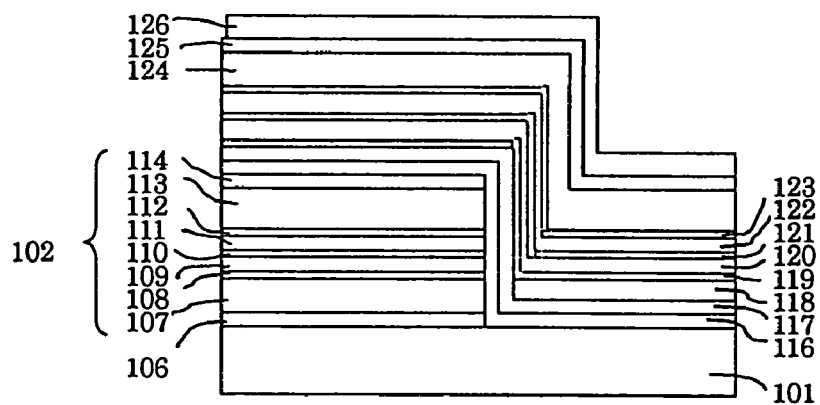

In FIG. 2C, MBE (Molecular Beam Epitaxy) is performed to form the semiconductor stacked-layered structure for the DVD laser section on exposed substrate surface 115. Specifically, the structure includes an n type GaAs buffer layer 116, an n type GaInP buffer layer 117, an n type $(Al_{0.7}Ga_{0.3})_{0.5}In_{0.5}P$ clad layer 118, an undoped $(Al_{0.5}Ga_{0.5})_{0.5}In_{0.5}P$ guide layer 119, an active layer 120 having an MQW structure, an undoped $(Al_{0.5}Ga_{0.5})_{0.5}In_{0.5}P$ guide layer 121, a p type $(Al_{0.7}Ga_{0.3})_{0.5}In_{0.5}P$ first clad layer 122, a p type GaInP etch stop layer 123, a p type $(Al_{0.7}Ga_{0.3})_{0.5}In_{0.5}P$ second clad layer 124, a p type GaInP intermediate layer 125, and a p type GaAs cap layer 126, which are formed successively.

Figure 2D:
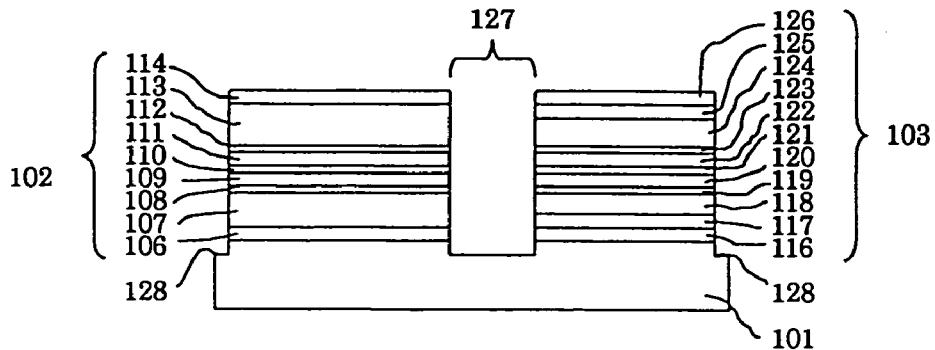

In FIG. 2D, photolithography and wet etching are performed to remove an unnecessary portion of the semiconductor stacked-layered structure for the DVD laser section having been formed on the semiconductor stacked-layered structure for the CD laser section. At the same time, a laser section isolating trench 127 reaching substrate 101 is formed to electrically isolate CD laser section 102 and DVD laser section 103 from each other, and a chip separating trench 128 is also formed.

Figure 2E:
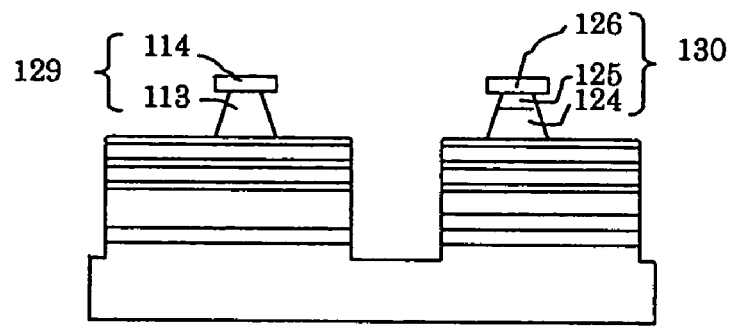

Thereafter, in FIG. 2E, a $SiO_2$ mask (not shown) shaped in a 3 to 4 μm wide band is formed over both of p type GaAs cap layers 114 and 126 in the CD and DVD laser sections. Then, p type second clad layer 113 and p type cap layer 114 in the CD laser section, and p type second clad layer 124, p type GaInP intermediate layer 125, and p type GaAs cap layer 126 in the DVD laser section are processed by dry etching to have a prescribed ridge width. Further, wet etching is performed to trim the shape of each ridge.

Figure 2F:
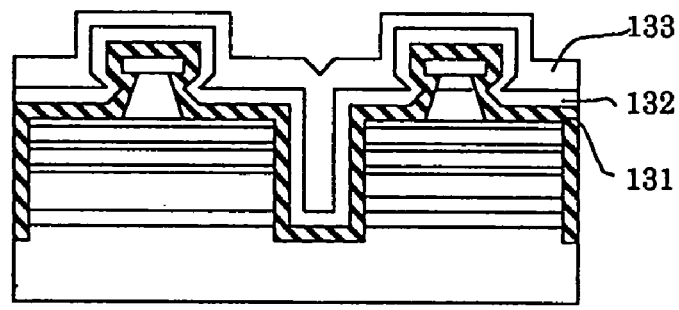

In FIG. 2F, MOCVD is performed to successively form an n type GaAs layer 131, an n type $Al_{0.4}Ga_{0.6}As$ etch stop layer 132, and an n type GaAs current blocking layer 133, such that either side of a ridge portion 129 in the CD laser section and either side of a ridge portion 130 in the DVD laser section are buried in these layers.

Figure 2G:
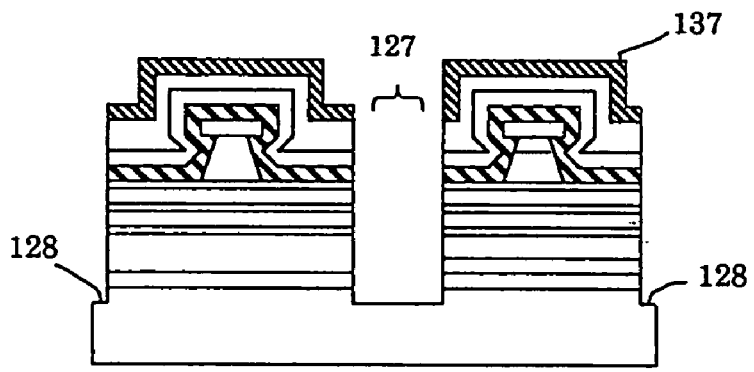

In FIG. 2G, a resist pattern 137 having band-shaped windows open above trench 127 to be formed for electrical isolation between the CD and DVD laser sections and above trench 128 to be formed for chip separation is formed over the CD and DVD laser sections by photolithography. Then, n type GaAs layer 131, n type $Al_{0.4}Ga_{0.6}As$ etch stop layer 132, and n type GaAs current blocking layer 133 are selectively removed by wet etching to form those trenches 127 and 128.

Figure 2H:
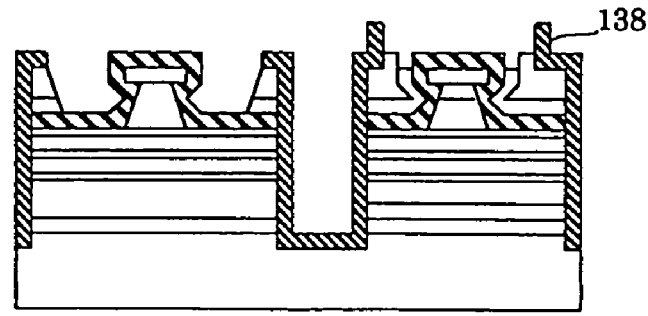

In FIG. 2H, resist 137 is removed, and then, to form a trench for being filled with an insulative dielectric film on either side of the ridge portion in the CD laser section, a resist pattern 138 having a band-shaped opening parallel to the ridge is formed by photolithography. Then, n type GaAs current blocking layer 133 is selectively removed with an ammonia-based etchant, and next, n type $Al_{0.4}Ga_{0.6}As$ etch stop layer 132 is selectively removed with hydrofluoric acid. It is to be noted that resist pattern 138 also has openings above the DVD laser section, and etching in the openings above the CD laser section is also applied to the openings above the DVD laser section at the same time.

Figure 2I:
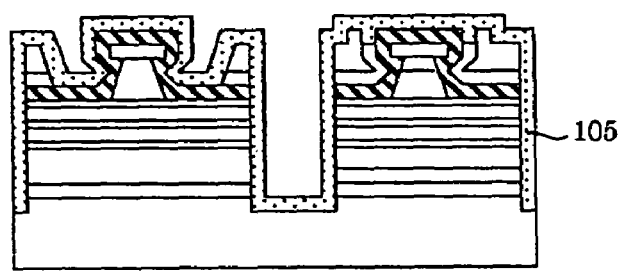

Thereafter, as shown in FIG. 2I, on a surface exposed after resist mask 138 is removed, insulative dielectric film 105 having a low refractive index (refractive index: 1 to 2) is formed by plasma CVD (Chemical Vapor Deposition), for example, as a silicon nitride ($SiN_x$) protective film. Although insulative dielectric film 105 may be a $SiO_2$ film formed by plasma CVD, it is necessary to pay attention to its film deposition temperature.

Firstly, a temperature higher than 150° C. is required as a lower limit of the film deposition temperature to ensure the refractive index and the strength of dielectric film 105. On the other hand, from the standpoint of preventing re-diffusion of impurities in the many semiconductor layers, a temperature lower than the growth temperatures of the semiconductor layers is desirable as an upper limit of the film deposition temperature, and thus a temperature lower than 400° C. is preferable.

Further, there is a difference in thermal expansion coefficients between the insulative dielectric film and the semiconductor layers, and thus a high deposition temperature of the insulative dielectric film may cause peeling of the insulative dielectric film. To prevent such peeling, it is preferable that the film deposition process is performed at a substrate temperature lower than 250° C.

Figure 2J:
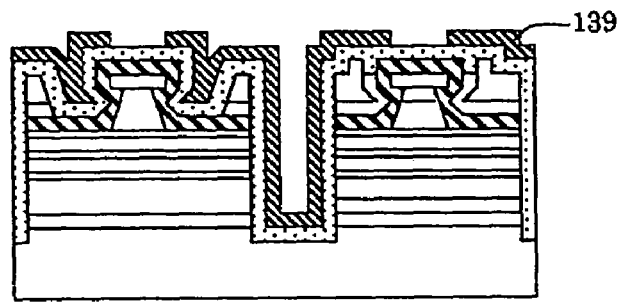

Thereafter, as shown in FIG. 2J, photolithography is performed to form a resist pattern 139 having band-shaped openings just above the ridge portions in the CD and DVD laser sections.

Figure 2K:
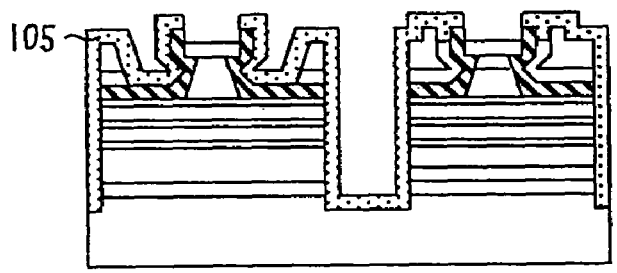

Using resist pattern 139 as a mask, insulative dielectric film 105 is partially removed with a prescribed etchant, and then n type GaAs layer 131 is selectively etched with an ammonia-based etchant such that etching stops at its underlying layer, as shown in FIG. 2K.

Figure 2L:
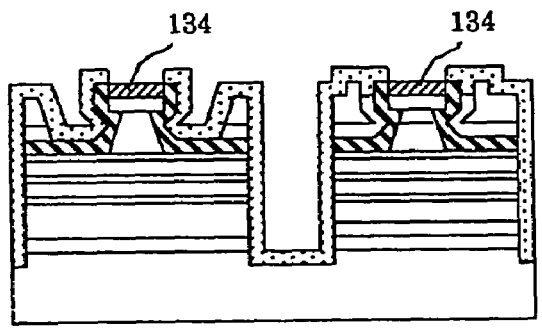

When the resist is removed after a p type ohmic electrode layer 134 of Au/AuZn is formed covering the etched regions by evaporation, p type ohmic electrode 134 is formed only on each of ridge portions 129 and 130 in the CD and DVD laser sections, as shown in FIG. 2L.

Figure 2M:
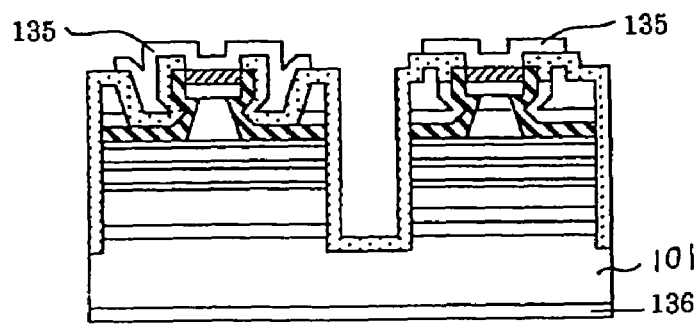

On p type ohmic electrode 134, a Mo/Au electrode pattern 135 is formed by photolithography and wet etching as shown in FIG. 2M, to recognize the CD and DVD laser sections as well as the direction of laser light emission. It is to be noted that the Au layer can be etched with an iodine-based etchant, and the Mo layer can be etched with an ammonia-based etchant. Thereafter, the obtained wafer is polished from the back side of the substrate so as to be about 100 μm thick, and an n type ohmic electrode 136 is formed on the back side of substrate 101.

In this manner, there is formed the monolithic two-wavelength semiconductor laser device of the first embodiment in which the CD laser section has the real guide structure and the DVD laser section has the loss guide structure (see FIG. 1).

As a comparative example, there was also fabricated a monolithic two-wavelength semiconductor laser device in which both of the laser sections have the loss guide structures, with the ridge portion in the CD laser section buried in the same way as the ridge portion in the DVD laser section.

Wafers including the two-wavelength laser devices of the aforementioned embodiment and the comparative example respectively formed thereon were each divided into a plurality of bars, and a divided side of each bar was coated with a reflective film. Thereafter, each bar was divided into a plurality of chips, and these chips were each mounted on a stem to measure laser device characteristics.

As a result, the lasing wavelength of the CD laser section with an optical output of 5 mW was 782 nm in both of the first embodiment and the comparative example. In addition, the lasing wavelength of the DVD laser section with an optical output of 4 mW was 656 nm in both of the first embodiment and the comparative example.

As for the operating current in the DVD laser section, almost the same characteristics were obtained in the first embodiment and in the comparative example. However, the operating current in the CD laser section with the optical output of 5 mW was 30 mA in the first embodiment and 60 mA in the comparative example, showing that the operating current in the first embodiment was lower than that in the comparative example by 30 mA. The laser device of the first embodiment and that of the comparative example had substantially the same reliability, though the former exhibited slightly better reliability than the latter.

Further, in measurement of relative intensity noise (RIN) with the optical output of 5 mW and with a quantity of feedback light in a range of 0.01% to 10%, good noise characteristics of less than −130 dB/Hz were observed at both 25° C. and 70° C. in both of the CD and DVD laser sections in each of the first embodiment and the comparative example.

Second Embodiment

Figure 3:
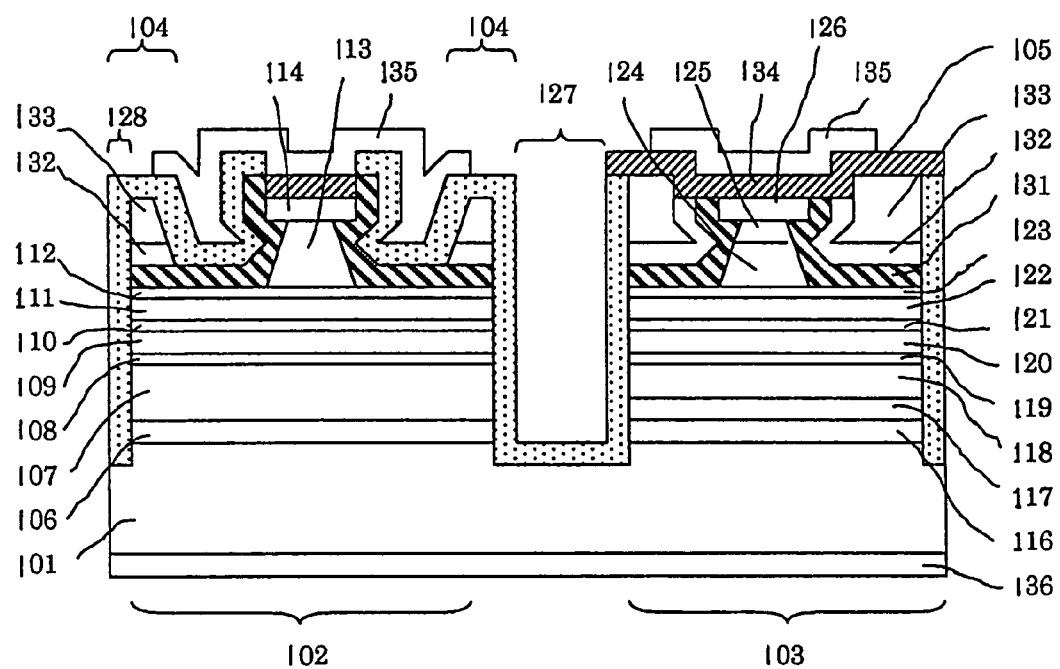
FIG. 3 is a schematic cross sectional view showing a monolithic two-wavelength semiconductor laser device according to a second embodiment of the present invention.
Figure 4:
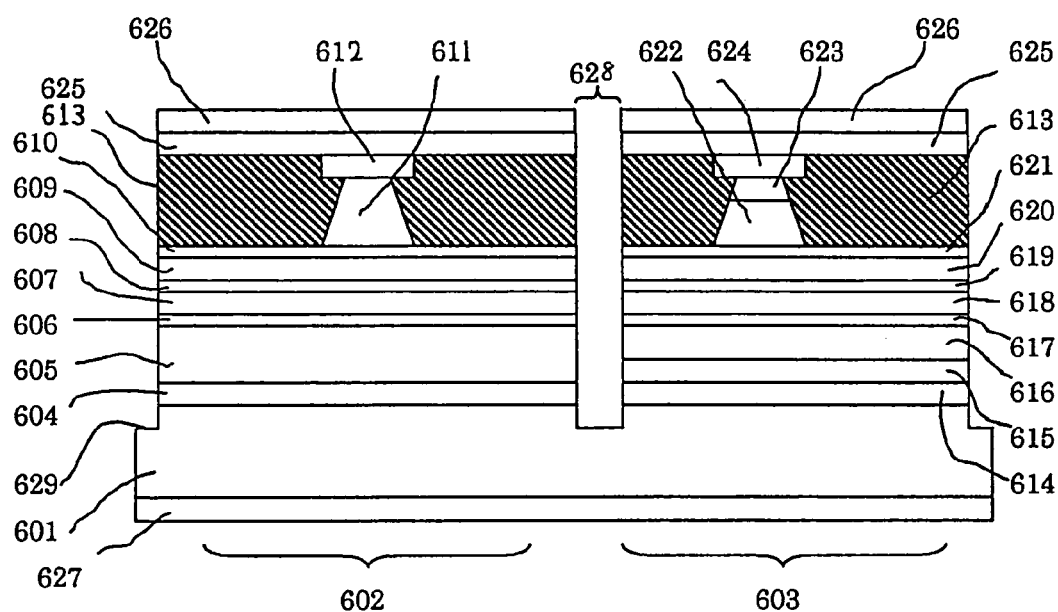
FIG. 4 is a schematic cross sectional view showing a conventional monolithic two-wavelength semiconductor laser device.

The schematic cross sectional view of FIG. 3 shows a monolithic two-wavelength semiconductor laser device according to the second embodiment of the present invention. The laser device of the second embodiment differs from that of the first embodiment only in that the opening of resist pattern 139 above the ridge portion in the DVD laser section in FIG. 2J is widened to additionally remove insulative dielectric film 105 on n type GaAs current blocking layer 132. In the DVD laser section according to the second embodiment, there is no insulative dielectric film having thermal conductivity lower than that of the semiconductor crystal, and thus better thermal radiation is achieved and reliability of the laser device is further improved even as compared to the laser device of the first embodiment.

It is to be noted that an n type GaAs inclined substrate having a main surface inclined at an off-angle of 15° from a (001) plane toward a [110] direction is used in the above embodiments for the purposes of adjusting the lasing wavelength of the DVD laser section to fall in the vicinity of 650 nm which is the wavelength for the DVD standard, and improving crystallinity of the CD and DVD laser sections.

To adjust the lasing wavelength of the DVD laser section, an off-angle of more than 5° is required. The effect to improve the crystallinity of the CD and DVD laser sections can be obtained at an off-angle of about 5° to about 25°, more preferably in a range of 10° to 20°. Still more preferably, if an inclined substrate having an off-angle of 13° to 18° is used, satisfactory laser device characteristics can be achieved.

As has been described above, according to the present invention, a monolithic multiple-wavelength laser device having maintained reliability as well as improved operating current, reduced feedback light noise and the like can readily be obtained by forming a real guide structure in a lasing section for a CD and forming a loss guide structure in a lasing section for a DVD.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A monolithic multiple-wavelength laser device comprising a laser section emitting at a first wavelength and a laser section emitting at a second wavelength formed on a surface of a single GaAs substrate, wherein said laser section emitting at the first wavelength includes a real guide structure and said laser section emitting at the second wavelength includes a loss guide structure, and wherein a burying layer on either side of a ridge portion included in said laser section emitting at the first wavelength is formed with a structure comprising a GaAs layer having a thickness more than 0.03 µm and less than 0.05 µm and an insulative dielectric film having a refractive index lower than that of said ridge Portion.

2. The monolithic multiple-wavelength laser device according to claim 1, wherein said insulative dielectric film has a refractive index in a range of 1 to 2.

3. The monolithic multiple-wavelength laser device according to claim 1, wherein said insulative dielectric film having a low refractive index is made of a silicon nitride film or a silicon oxide film.

4. The monolithic multiple-wavelength laser device according to claim 1, wherein said insulative dielectric film having a low refractive index has a thickness in a range of 0.1 µm to 0.2 µm.

5. The monolithic multiple-wavelength laser device according to claim 1, wherein the surface of said GaAs substrate has an off-angle in a range of 5° to 25° from a (001) plane toward a [110] direction.

6. A method of fabricating the monolithic multiple-wavelength laser device of claim 1, wherein said insulative dielectric film having a low refractive index is formed at a film deposition temperature in a range of 150° C. to 400° C.

7. The method of fabricating the monolithic multiple-wavelength laser device according to claim 6, wherein said flint deposition temperature of said insulative dielectric film having a low refractive index is in a range of 150° C. to 250° C.

8. The method of fabricating the monolithic multiple-wavelength laser device according to claim 6, wherein the ridge portion included in said laser section of the first wavelength and a ridge portion included in said laser section of the second wavelength are both buried in a multi-layered structure formed of a GaAs layer, an $Al_xGa_{1-x}As$ $(0.4 \leq x \leq 0.7)$ etch stop layer, and a GaAs current blocking layer, in said multi-layered structure burying the ridge portion of said laser section of the first wavelength, an ammonia-based etchant is used for said GaAs current blocking layer and a hydrofluoric add-based etchant is used for said etch stop layer to selectively etch said layers such that etching stops at respective underlying layers, and the ridge portion of said laser section of the first wavelength exposed thereafter is buried in said insulative dielectric film having a low refractive index.

* * * * *